United States Patent [19]
Simmons

[11] Patent Number: 5,134,912
[45] Date of Patent: Aug. 4, 1992

[54] TAB TAPE SINGULATION APPARATUS AND METHOD

[75] Inventor: Richard L. Simmons, Jonestown, Tex.

[73] Assignee: Microelectronics and Computer Technology Corporation, Austin, Tex.

[21] Appl. No.: 588,863

[22] Filed: Sep. 27, 1990

[51] Int. Cl.$^5$ .............. B26D 5/08; B26D 7/02
[52] U.S. Cl. ................... 83/42; 83/375; 83/464; 83/564; 83/589; 83/599; 83/694
[58] Field of Search ........... 83/32, 42, 456, 460, 83/464, 466, 564, 589, 599, 598, 649, 694, 375, 382, 385, 386, 459

[56] References Cited

U.S. PATENT DOCUMENTS

| | | | |
|---|---|---|---|
| 1,002,296 | 9/1911 | McPike et al. | 83/598 X |
| 1,331,563 | 2/1920 | Genter | 83/464 X |
| 2,353,390 | 7/1944 | Carlin | 83/375 |
| 3,161,101 | 12/1964 | Falk | 83/599 X |
| 3,186,279 | 6/1965 | Rengel | 83/598 X |
| 4,180,181 | 12/1979 | Brandwein | 221/70 |
| 4,228,707 | 10/1988 | Arlett | 83/375 X |
| 4,478,352 | 10/1984 | Admundson et al. | 221/13 |
| 4,492,315 | 1/1985 | Hooper | 221/186 |
| 4,589,314 | 5/1986 | Ralph et al. | 83/456 X |
| 4,657,158 | 4/1987 | Faes et al. | 221/25 |
| 4,951,540 | 8/1990 | Cross et al. | 83/599 X |

OTHER PUBLICATIONS

International Micro Devices Product Specification, "FRA-6610 Manual Tape Framer Station," Rev. A, Jan., 1989.

Primary Examiner—Frank T. Yost
Assistant Examiner—Eugenia A. Jones
Attorney, Agent, or Firm—Fulbright & Jaworski

[57] ABSTRACT

An apparatus and method for cutting strip or reel form of TAB tape into individual sites ready for further processing. In addition, a lead plating buss may be removed at the same time. A universal and adjustable apparatus includes preferably two cutter assemblies positioned adjacent a replaceable tape adapter and a clamp foot is actuated prior to cutting, for holding the tape, and is also magnetically attracted toward the movable cutter blade.

10 Claims, 4 Drawing Sheets

TAB TAPE SINGULATION APPARATUS AND METHOD

BACKGROUND OF INVENTION

The present invention relates to a TAB tape singulation/isolation apparatus and method. The purpose is to cut a strip or reel form of tape-automated-bonding (TAB) tape into individual sites ready for further processing. The invention also includes provision for lead buss isolation at the same time.

TAB tape is usually made in strip form with a plurality of individual tape sites adjacent to one another in a row. However, it is frequently desirable to individually handle a sub assembly of a single die bonded to a tape site. This requires that the strip of tape be cut into individual tape sites.

Also present on the tape during most tape manufacturing processes is a plating buss that shorts all the interconnected leads of the tape site together. Prior to electrically testing of the site, this plating buss must be severed in order to isolate the leads within a tape site. The present apparatus and method allows the plating buss to be removed, that is isolated, at the same time that the site is singulated.

The present invention is directed to a universal and adjustable apparatus and method which satisfies a large range of site-singulation and buss-isolation requirements. The invention is useful on many different TAB tape configurations due to the adjustability of the components. The invention is usable for simple tape site singulation as well as singulate/isolate.

SUMMARY

The present invention is directed to a TAB tape singulation apparatus for cutting a length of tape into individual tape sites and includes a support body, a tape adapter supported by the body for aligning and positioning a tape, and at least one cutter assembly supported by the body adjacent the tape adapter. Each cutter assembly includes a stationary blade, a movable blade movable relative to the stationary blade, and a tape clamp foot movable toward and away from the stationary blade for holding the tape while it is being cut by the blades.

A further object of the present invention is wherein the clamp foot is pivotally carried between its ends by a clamp arm for providing an even and compliant clamping force on a tape.

Still another object of the present invention is wherein the clamp is movable in a direction toward the movable blade and said clamp is magnetically attracted to the movable blade.

Yet, a still further object to the present invention includes means for moving the clamp foot into engagement with a tape prior to cutting the tape with the blades.

A further object of the present invention is wherein the tape adapter is releasably supported by the body for replacement by a different adapter for accommodating different tapes.

A further object is wherein the tape adapter and the cutter assembly are adjustably positioned relative to each other.

Still another further object of the present invention is a provision of a cutter assembly on opposite sides of the tape adapter, thereby providing two cutter assemblies for making a double cut.

Another object is wherein the body includes first and second parallel extending rods and the tape adapter includes first and second parallel extending recesses for coacting with the first and second rods, respectively, for releasably positioning the adapter. Releasable locking means are provided between the adapter and one of the rods for adjustably positioning and locking the tape adapter.

Another object of the present invention is wherein a rotatable means is connected to and actuates the movable blade and the clamp foot, and a lost motion connection is provided between the rotatable means and the movable blade for delaying the cutting action until the foot has clamped the tape.

A still further object of the present invention is the provision of a method for cutting a length of TAB tape into individual tape sites and includes aligning and positioning the length of tape in a cutter for cutting the tape at an edge of an individual tape site, clamping said edge against a support, and cutting the edge after clamping. The method further includes moving the tape for aligning and positioning a second edge of the cut tape site in the cutter for cutting the second edge, clamping the second edge against a support, and cutting the second edge after clamping.

Another object is wherein the clamping step is performed by clamping with a clamping foot having a pivoting connection intermediate the ends of the foot for providing an even and compliant clamping force against the edge.

Still another object is the method wherein the clamping is performed by a clamping foot and includes the step of magnetically moving the clamping foot toward the cutter for holding the edge more firmly during cutting.

Yet a further object of the present invention is the provision of a method of cutting a length of TAB tape, having a plating buss on opposite edges of each individual tape site, into individual tape sites with the plating busses removed and includes aligning and positioning the length of tape between two cutters for cutting an individual tape site on opposite edges inside the adjacent plating busses. The method includes clamping each edge against a support, and cutting each edge inside the adjacent plating buss after clamping said edge, thereby providing an individual tape site singulation and buss removal.

Another object is wherein the two edges are simultaneously cut by the two cutters.

Other objects, features and advantages will be apparent from the following description of a presently preferred embodiment of the invention, given for the purpose of disclosure, and taken in conjunction with the accompanying drawings.

DESCRIPTION OF THE PREFERRED EMBODIMENT

Figure 1:
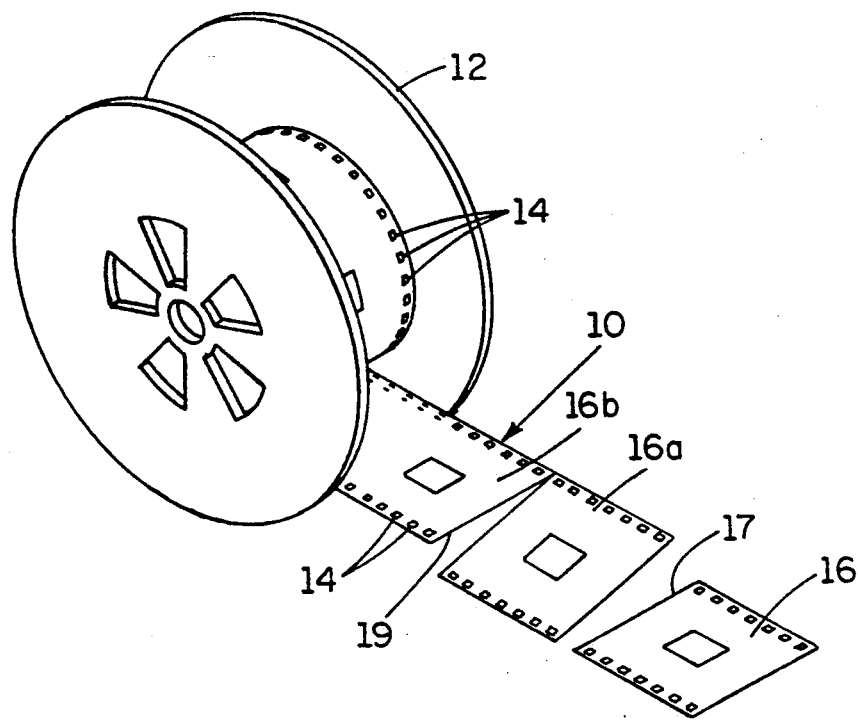
FIG. 1 is a perspective elevational view of a TAB tape on a reel illustrating the method of singulation of a tape into individual sites.

Referring now to FIG. 1, the reference numeral 10 generally indicates a conventional TAB tape, such as 35 mm, which is stored in strip or reel form, herein shown on a reel 12. The tape 10 includes the conventional sprocket holes 14 on either side and includes a plurality of individual tape sites 16, 16a, 16b, etc. adjacent to one another in a row. It is frequently desirable to cut the tape 10 into individual sites 16, 16a, and 16b, etc. for further processing, such as bonding a single die to an individual tape site. FIG. 1 illustrates the method of cutting the individual tape sites, such as 16 and 16a, from the tape 10 by a single cut line 17 and 19 to provide singulated sites 16 and 16a. That is, the tape sites are cut from the tape 10 by a single line cut that severs the leading site from the adjacent site. Single cutting is usually used when no material is removed between adjacent sites. One feature of the present invention is an apparatus for single cutting.

Figure 2:
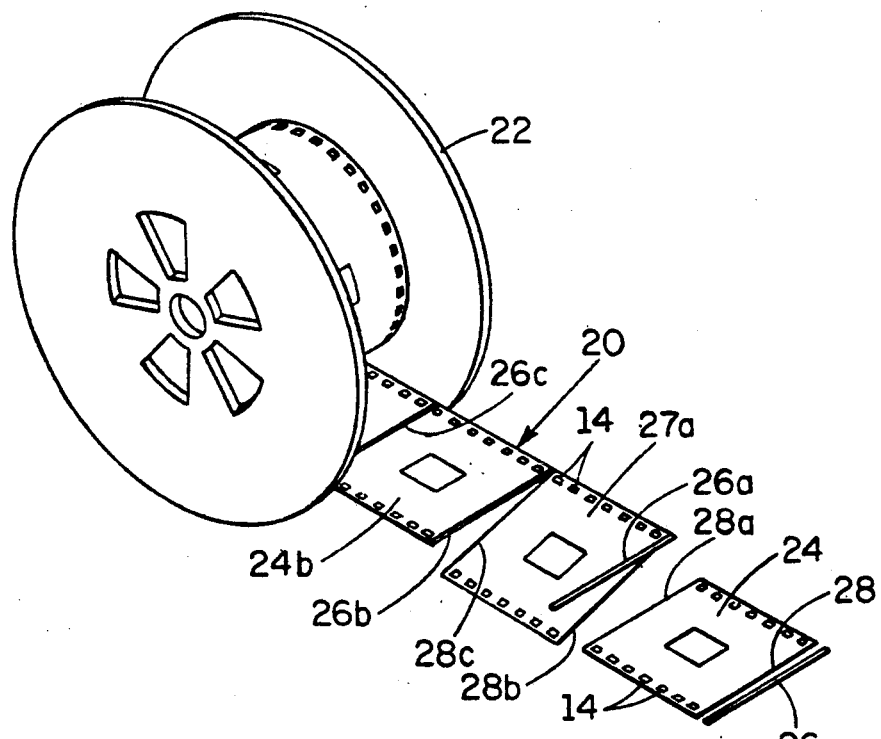
FIG. 2 is a perspective elevational view of a reel of TAB tape containing plating busses between individual sites, illustrating the method of singulation and isolation of a TAB tape into individual sites.

However, a plating buss is also present on the tape during most tape manufacturing processes. Referring now to FIG. 2, a TAB tape, generally indicated by the reference numeral 20, is shown on a reel 22 having a plurality of individual tape sites, such as sites 24, 24a and 24b. A plating buss is placed between each of the sites. Thus, a plating buss 26, 26a, 26b and 26c is placed between each of the individual sites. The plating busses must be removed in order to isolate the leads within each tape site. Another feature of the present invention is the provision of an apparatus that cuts on both sides of each tape site inside the adjacent plating buss thereby performing buss isolation at the same time as singulation. That is, the present apparatus and method provides a cut 28 and 28a at each edge of the site 24 thereby providing singulation of the site 24 as well as detaching the busses 26 and 26a from the site 24. Similarly, cutting along the edges 28b and 28c of site 24a singulates and isolates site 24a from the busses 26a and 26b. The cutting of the opposite edges of each of the sites may be done individually or simultaneously.

Figure 4:
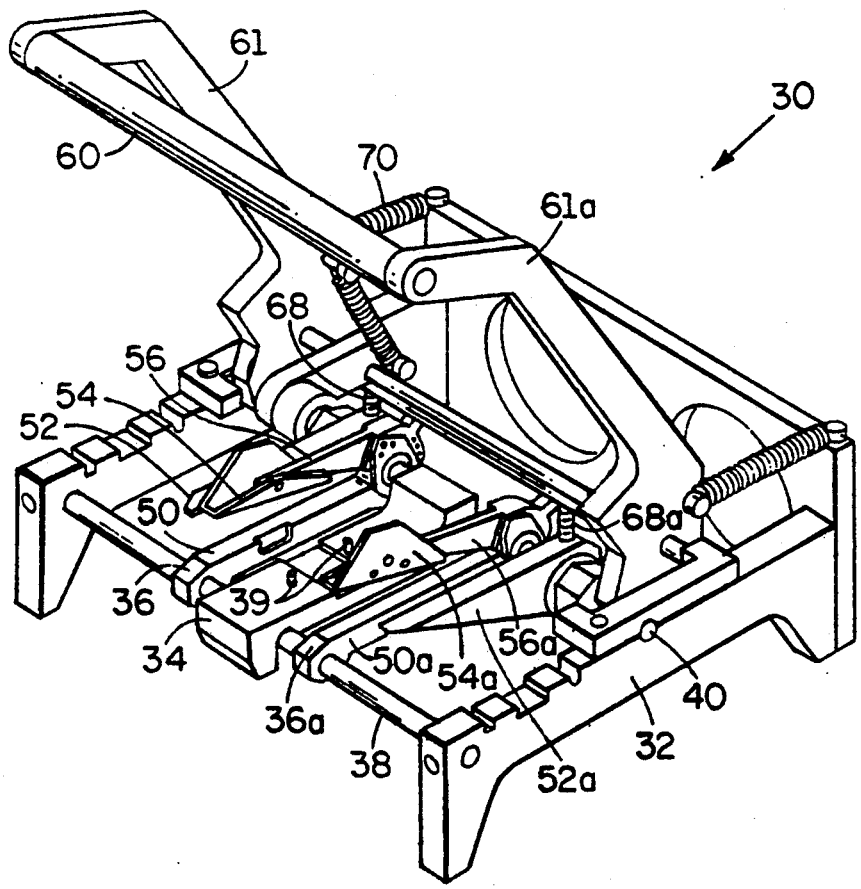
FIG. 4 is a perspective elevational view of the apparatus of the present invention.
Figure 5:
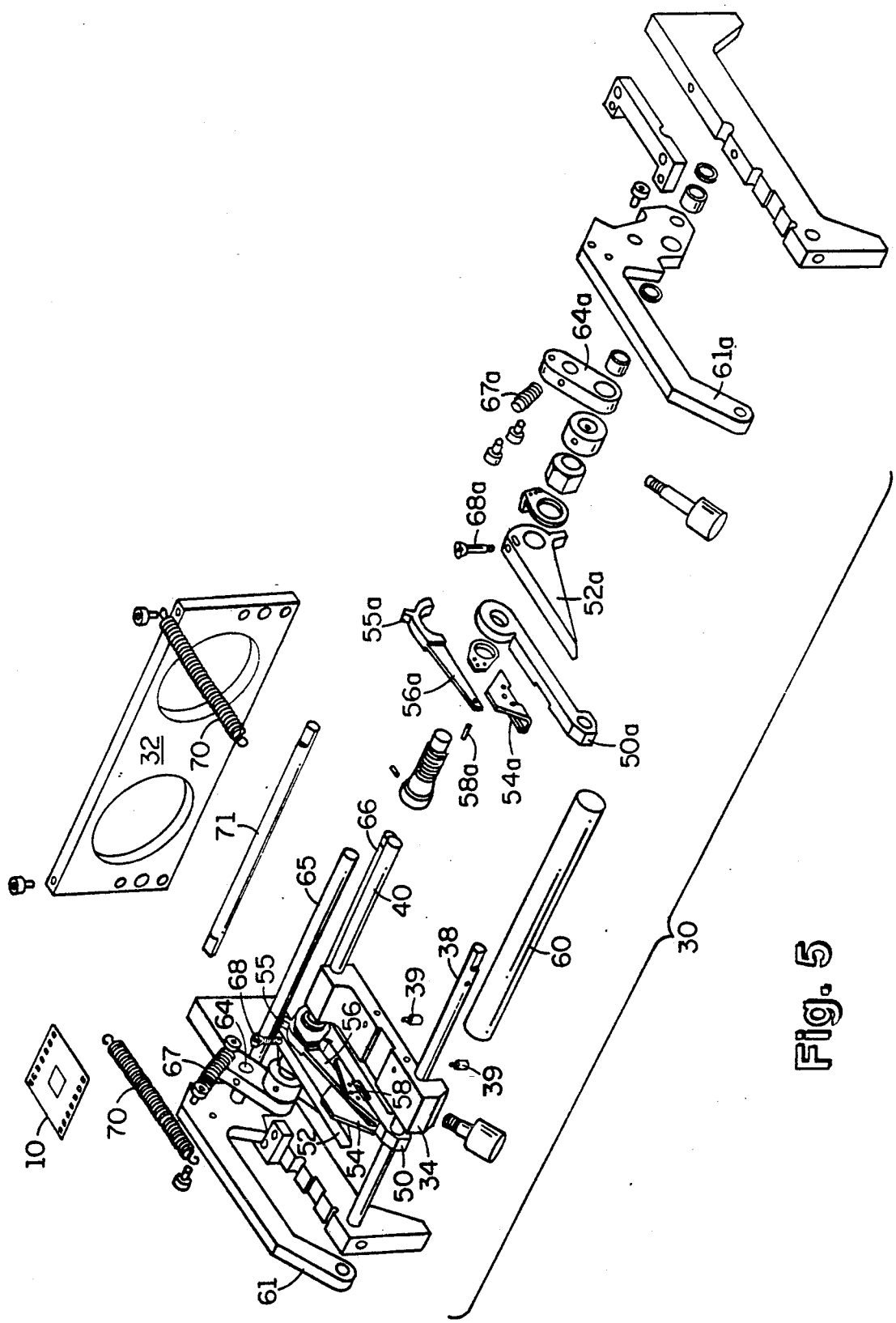
FIG. 5 is a partially exploded, perspective view of the apparatus of FIG. 4.

Referring now to FIGS. 4 and 5, the reference numeral 30 generally indicates the TAB tape singulation apparatus of the present invention and generally includes the support body 32, a tape adapter 34 supported by the body 32, at least one cutter assembly, and preferably two cutter assemblies generally indicated by the reference numerals 36 and 36a, respectively, which are identical but mirror images of each other.

The body 32 includes first and second longitudinally extending and parallel rods 38 and 40. The tape adapter 34 is designed to align and position a specific tape 10 or 20 configuration, but can be easily removed and replaced with a different tape adapter for handling a different tape configuration.

Figure 6:
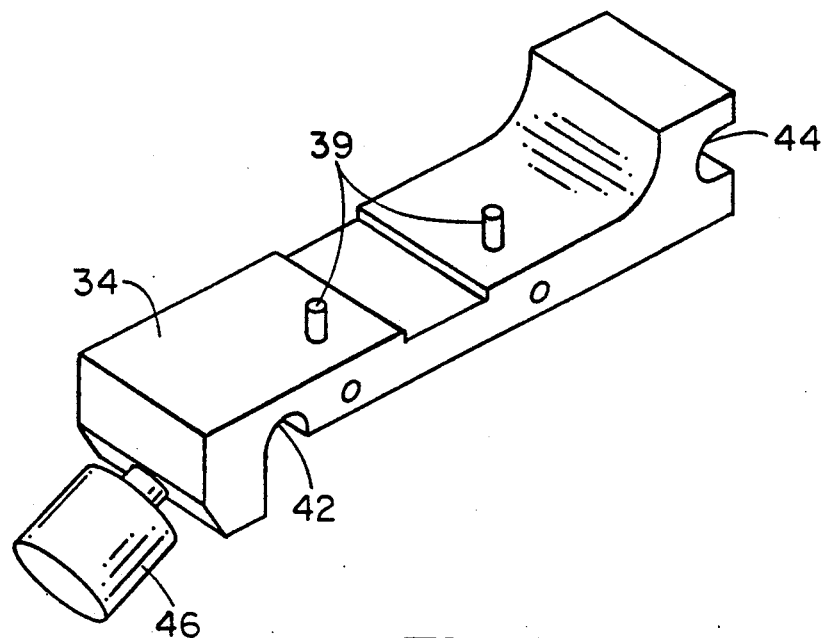
FIG. 6 is an enlarged perspective elevational view of a tape adapter of the present invention.

Referring to FIGS. 4, 5 and 6, the tape adapter 34 includes tooling pins 39 extending above its upper surface for engaging the sprocket holes 14 in the tape 10 or 20 for aligning and positioning the tape 10 or 20 in the apparatus 30. The adapter 34 also includes first and second parallel extending recesses 42 and 44, for coacting with the rods 38 and 40, respectively, of the body 32 for slidably and longitudinally positioning the adapter 34 in a desired location. A thumbscrew 46 is provided near the front for engaging the rod 38 for ease of adjustment or removal of the tape adapter 34 and/or replacement with a different tape adapter for handling other types and sizes of tape. The adapter 34 provides for the repeatable alignment and registration of the individual tape sites relative to the cutters 36 and 36a.

Figure 7:
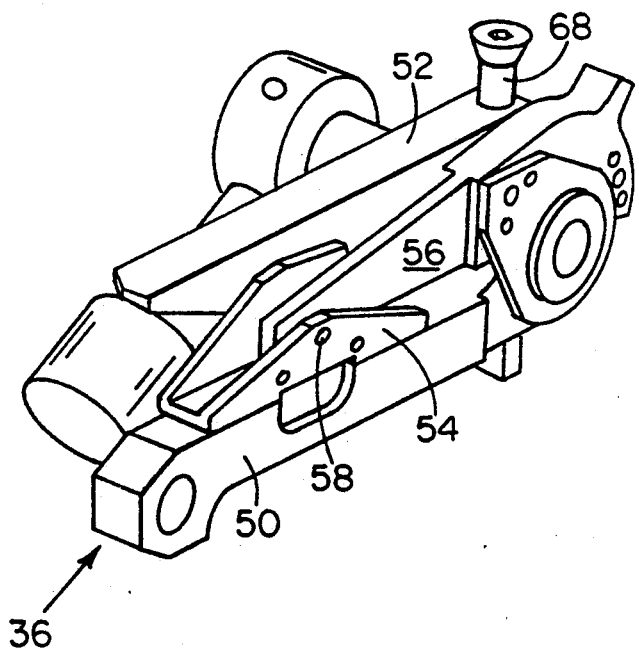
FIG. 7 is an enlarged perspective elevational view of a cutter assembly.

Referring now to FIGS. 4, 5 and 7, the construction of the cutters 36 and 36a may best be seen. Each of the cutter's assemblies 36 and 36a generally include a stationary blade 50 and 50a, respectively, a movable blade 52 and 52a, respectively, and a tape clamp foot 54 and 54a, respectively.

In order that the clamp feet 54 and 54a may provide an even and compliant clamping force for clamping the tape 10 or 20 onto the stationary blades 50 and 50a, respectively, each foot 54 and 54a is carried between its ends by a clamp arm 56 and 56a, respectively, by a pin 58 and 58a, respectively. Therefore, as the clamp arms are moved towards the stationary blades, the feet will rotate on the pins to evenly conform to the top surface of the stationary blades. Preferably, the feet 54 and 54a are generally U-shaped in cross section with the clamp arms 56 and 56a connected between the legs of the U-shape. In addition, the pins 58 and 58a are transversely movable relative to the arms 56 and 56a for allowing the feet 54 and 54a to move transversely towards the movable arms 52 and 52a. Preferably, the stationary blades 50 and 50a and the movable blades 52 and 52a are of a heat treated ground tool steel and the clamping feet 54 and 54a are of an unhardened magnetized tool steel. Therefore, because of the transversely movable pivot pins 58 and 58a, the clamp feet 54 and 54a may be attracted to and moved toward the movable blades 52 and 52a, respectively, whereby each clamp foot will crowd the plane of the moving blade and hold the tape clamped as close as possible to the cutting line.

Any suitable manual, mechanical or automatic means are provided for actuating one or both of the cutter assemblies 36 and 36a. For example, a handle 60 may be connected to and actuate arms 61 and 61a which rotate on shaft 40. Cutter rods 65 and 66 extend between the arms 61 and 61a. Rotation of rod 66 engages pins 68 and 68a for actuation of the movable cutters 52 and 52a, respectively. Reverse actuation of handle 60 causes rod 65 to engage the backside of blades 52 and 52a and retract them from the stationary blades 50 and 50a. Springs 70 between body 32 and the arms 61 and 61a normally bias the cutter assemblies 36 and 36a to the open position.

However, it is desirable to provide means for moving the clamp feet 54 and 54a into engagement with a tape 10 prior to cutting the tape with the blades. Therefore, a linkage is provided between the handle 60 and the actuation of the movable cutters 52 and 52a in order to allow the feet 54 and 54a to clamp the tape. Spring arms 64 and 64a rotate on shaft 40 and are connected to arms 61 and 61a, respectively, by springs 67 and 67a, respectively, and thus are rotated by the handle 60. A clamp rod 71 is connected to arms 64 and 64a and when rotated contacts and actuates clamp arms 56 and 56a and resiliently moves them into engagement with the stationary blades 50 and 50a. When handle 60 is raised, either by manual force or due to spring bias, rod 66 presses on front ears 55 and 55a which project from clamp arms 56 and 56a, respectively, thereby retracting the clamps arms 56 and 56a with the motion of handle 60. However, the actuation mechanism provides a loss motion connection to insure that the feet 54 and 54a move into engagement with the tape prior to cutting. Thus the rod 71 engages clamp arms 56 and 56a before the rod 66 engages the cutter pins 68 and 68a.

It is also to be noted that the distance between the cutters 36 and 36a may be suitably adjusted relative to each other and to the tape adapter 34. The cutter assemblies 36 and 36a may be adjusted to cut any length of tape 10 with a single or double cutting action. For example only, in one embodiment, the cutter assemblies 36 and 36a are infinitely adjustable for double cutting lengths ranging from 0.56 to 2.05 inches. That is, the apparatus 30 was designed to allow double cut adjustment of from 3 to 11 sprocket pitch site singulations (pitch = 0.187 inches). With single cutting, the apparatus 30 can be used to cut off from near zero (about 0.005 inches) to whatever length is required. The cutting assemblies 36 and 36a are adjusted by changing their positions on shaft 40.

After adjustment, a length of tape is aligned and positioned in the cutter 30 by engagement with the pins 39 on the tape adapter 34 which allows one or both edges of an individual tape site to be positioned at the proper location at one or both of the cutters 36 and 36a. The individual tape sites can be double or single cut by having the two cutters 36 and 36a actuated simultaneously, or one is actuated and one is idle. Single cutting is mainly used where the tape sites are separated with a single cut line as best seen in FIG. 1. After aligning and positioning the tape 10 relative to the tape adapter 34, the edge to be cut is clamped against a support such as the stationary blade and the edge is cut after clamping. In single cutting, the tape is moved for aligning and positioning a second edge of the cut tape site in the cutter for cutting the second edge, the second edge is clamped, and the second edge is cut.

However, double cutting, as illustrated in FIG. 2, allows the apparatus 30 to fully singulate an individual tape site that is separated from its neighbor by a plating buss.

The method of cutting a length of TAB tape having a plating buss on opposite edges of each individual tape site into individual tape sites with the plating busses removed is performed by aligning and positioning the length of tape 20 between the two cutters 36 and 36a by means of the tape adapter 34. Each edge to be cut is clamped against a support or stationary blade and cutting of each edge inside the adjacent plating buss is performed after clamping the edges thereby providing an individual tape site singulation and buss removal. The step of cutting each edge may be alternately or simultaneously.

While the foregoing description of the TAB tape singulation apparatus 30 may be used to provide individual sites in a hand operated tool, one or more of the cutter assemblies 36 and 36a may be used in an automatic controller for cutting TAB tape and attaching a die or chip by bonding to the individual sites.

Figure 3:
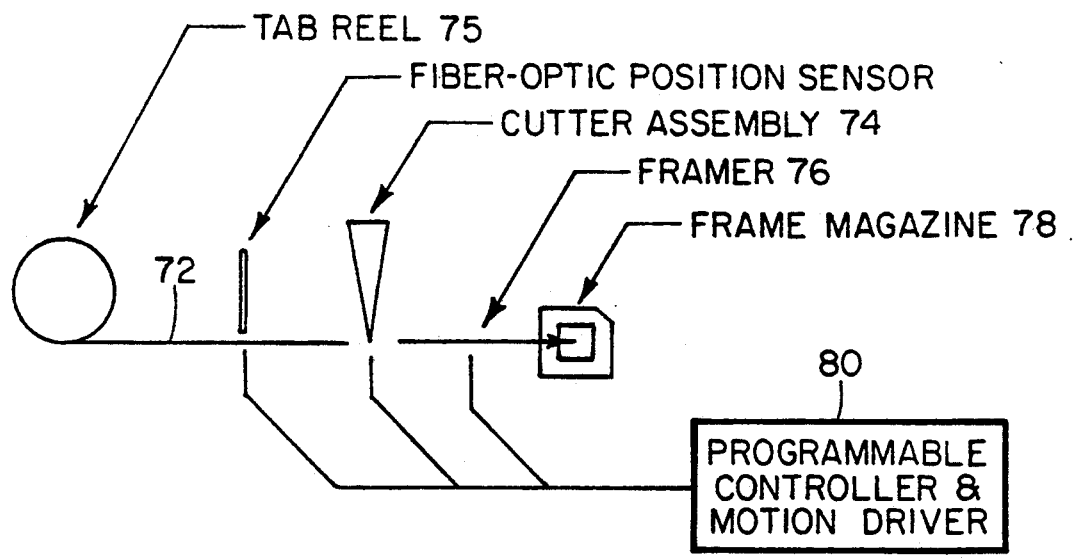
FIG. 3 is a schematic view of the use of a cutter assembly of the present invention in an automated TAB site framing operation.

Referring to FIG. 3, a reel 75 containing a TAB tape 72 is carried through a first station of a suitable sensor such as a fiber optic position sensor for aligning and positioning the tape 72 relative to one or more cutter assemblies 74 to provide an individual tape site. The individual tape site is then transmitted to a conventional framer 76 for attaching a suitable chip or die to the site and the accumulated die bonded sites are collected in a frame magazine 78. All of the foregoing may be suitably controlled by a programmable controller and motion driver 80.

The present invention, therefore, is well adapted to carry out the objects and attain the ends and advantages mentioned as well as others inherent therein. While a presently preferred embodiment of the invention has been given for the purpose of disclosure, numerous changes in the details of construction and arrangement of parts, and steps of the process, will be readily apparent to those skilled in the art, and which are encompassed within the spirit of the invention and the scope of the appended claims.

What is claimed is:

1. A tape-automated bonding singulation apparatus for cutting a length of tape into individual tape sites comprising,
   a support body,
   a tape adapter supported by the body for aligning and positioning a tape,
   at least one cutter assembly supported by the body adjacent the tape adapter including,
   a stationary blade,
   a movable blade movable relative to the stationary blade, and
   a tape clamp foot movable toward and away from the stationary blade for holding the tape while it is being cut by the blades, wherein the clamp foot is movable in a direction toward the movable blade and said clamp foot is magnetically attracted to the movable blade.

2. The apparatus of claim 1 wherein the clamp foot is pivotally carried between its ends by a clamp arm for providing an even and compliant clamping force on the tape.

3. The apparatus of claim 1 including means for moving the clamp foot into engagement with the tape prior to cutting the tape with the blades.

4. The apparatus of claim 1 wherein the tape adapter is releasably supported by the body for replacement by a different adapter.

5. The apparatus of claim 1 wherein the tape adapter and the cutter assembly are adjustably positioned relative to each other.

6. The apparatus of claim 1 including two cutter assemblies on opposite sides of the tape adapter.

7. The apparatus of claim 1 wherein the body includes first and second parallel extending rods and said tape adapter includes first and second parallel extending recesses for coacting with the first and second rods, respectively, for adjustably positioning said tape adapter, and
   releasable locking means between the tape adapter and one of the rods.

8. The apparatus of claim 1 including,
   rotatable means connected to and actuating said movable blade and said clamp foot, and
   a lost motion connection between the rotatable means and the movable blade for delaying the cutting action until the foot has clamped the tape.

9. A method of cutting a length of a tape-automated bonding tape into individual tape sites comprising,
   aligning and positioning the length of tape in a cutter for cutting the tape at an edge of an individual tape site, said cutter having a stationary blade and a movable blade movable relative to the stationary blade,
clamping said edge against a support,
cutting the edge after clamping,
moving the tape for aligning and positioning a second edge of the cut tape site in the cutter for cutting the second edge,
clamping the second edge against a support, and
cutting the second edge after clamping, wherein the clamping is performed by a clamping foot and including magnetically moving the clamping foot toward the movable blade of the cutter for holding the edge firmly during cutting.

10. The method of claim 9 wherein the clamping step is performed by clamping with a clamping foot having a pivoting connection intermediate the ends of the clamping foot providing an even clamping force against the edge.

* * * * *